United States Patent
Paul et al.

(10) Patent No.: US 10,156,624 B2
(45) Date of Patent: Dec. 18, 2018

(54) METHOD AND MAGNETIC RESONANCE APPARATUS FOR RECONSTRUCTING AN MR IMAGE DEPENDENT ON THE CHEMICAL SHIFT

(71) Applicant: Siemens Aktiengesellschaft, Munich (DE)

(72) Inventors: Dominik Paul, Bubenreuth (DE); Benjamin Schmitt, Naremburn NSW (AU)

(73) Assignee: Siemens Aktiengesellschaft, Munich (DE)

( * ) Notice: Subject to any disclaimer, the term of this patent is extended or adjusted under 35 U.S.C. 154(b) by 567 days.

(21) Appl. No.: 14/863,782

(22) Filed: Sep. 24, 2015

(65) Prior Publication Data

US 2016/0084930 A1    Mar. 24, 2016

(30) Foreign Application Priority Data

Sep. 24, 2014   (DE) ........................ 10 2014 219 320

(51) Int. Cl.
*G01R 33/565* (2006.01)
*G01R 33/48* (2006.01)

(52) U.S. Cl.
CPC ... *G01R 33/56527* (2013.01); *G01R 33/4818* (2013.01); *G01R 33/4828* (2013.01)

(58) Field of Classification Search
CPC .......... G01R 33/56527; G01R 33/4828; G01R 33/4818
See application file for complete search history.

(56) References Cited

U.S. PATENT DOCUMENTS 4,949,042 A * 8/1990 Kuhara .............. G01R 33/4828 324/309
5,446,384 A * 8/1995 Dumoulin .......... G01R 33/4828 324/307

(Continued)

OTHER PUBLICATIONS

Kwok et al: "3D Interleaved Water and Fat Image Acquisition with Chemical-Shift Correction"; Magnetic Resonance in Medicine vol. 44; pp. 322-330; (2000).

(Continued)

*Primary Examiner* — G.M. Hyder
(74) *Attorney, Agent, or Firm* — Schiff Hardin LLP

(57) ABSTRACT

In a method and magnetic resonance apparatus for reconstructing an MR image of a volume segment within an examination object, MR data within the volume segment are acquired according to a separation method by MR data for a k-space line being acquired respectively in steps while a readout gradient is activated in the same readout direction. An image of a first substance and an image of a second substance are thereby reconstructed. A shift length, by which the image of the first substance and the image of the second substance are displaced relative to one another due to the chemical shift in the readout direction is determined. The image of the first substance and/or the image of the second substance is shifted as a function of the shift length, to compensate for the relative displacement between the images of the first and second substances in the readout direction due to the chemical shift. An MR image is generated by combining the images of the first and second substances.

13 Claims, 4 Drawing Sheets

(56) References Cited

U.S. PATENT DOCUMENTS

| | | | | |
|---|---|---|---|---|
| 6,263,228 B1* | 7/2001 | Zhang | ............... | G01R 33/4828 |
| | | | | 128/899 |
| 6,373,249 B1* | 4/2002 | Kwok | ............... | G01R 33/4828 |
| | | | | 324/306 |
| 6,583,623 B1* | 6/2003 | Kwok | ............... | G01R 33/4828 |
| | | | | 324/306 |
| 2007/0285094 A1* | 12/2007 | Reeder | ............... | G01R 33/4828 |
| | | | | 324/313 |
| 2008/0048657 A1 | 2/2008 | Reeder | | |
| 2008/0048659 A1* | 2/2008 | Reeder | ............... | G01R 33/4824 |
| | | | | 324/312 |
| 2009/0072826 A1* | 3/2009 | Hargreaves | ........ | G01R 33/4828 |
| | | | | 324/309 |
| 2012/0256625 A1 | 10/2012 | Block et al. | | |
| 2014/0159724 A1 | 6/2014 | Praveen et al. | | |

OTHER PUBLICATIONS

An et. al.: "Chemical Shift Imaging With Spectrum Modeling", in: Magnetic Resonance in Medicine, 2001, vol. 46, pp. 126-130.
Bernstein et.al. Handbook of MRI Pulse Sequences, Chapter 17.3, Dixon's Method (2004,).

* cited by examiner

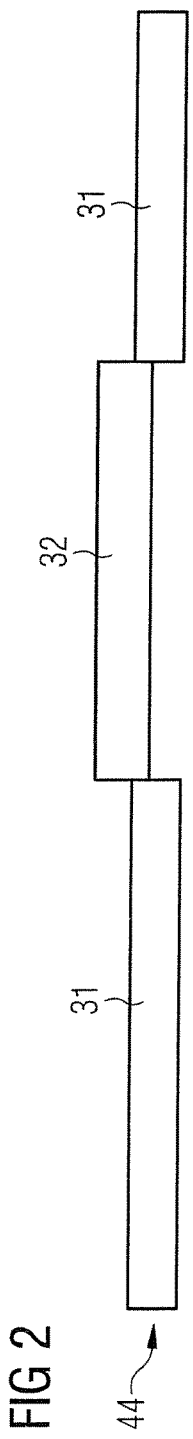
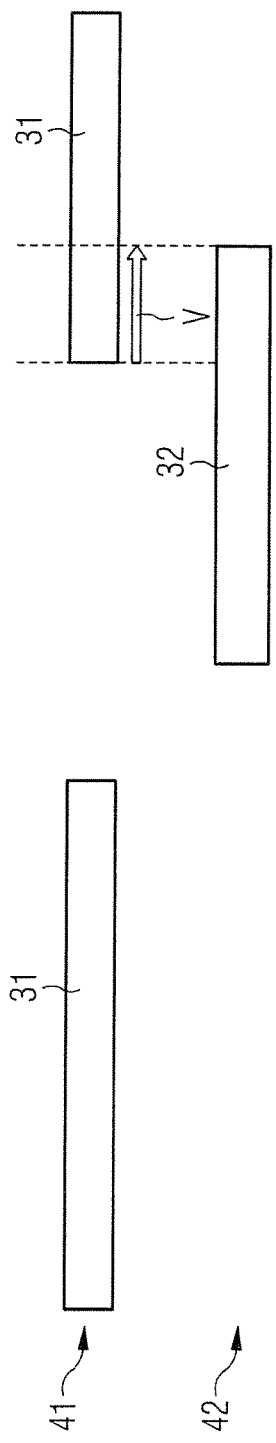
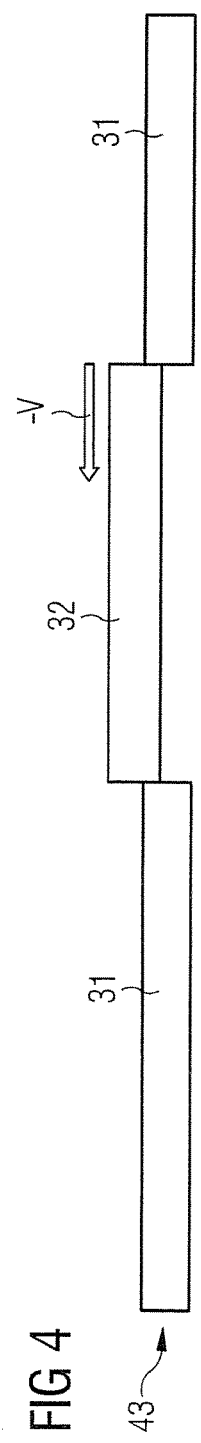
FIG 2
FIG 3
FIG 4

METHOD AND MAGNETIC RESONANCE APPARATUS FOR RECONSTRUCTING AN MR IMAGE DEPENDENT ON THE CHEMICAL SHIFT

BACKGROUND OF THE INVENTION

Field of the Invention

The present invention concerns a method and a magnetic resonance apparatus for reconstructing an MR image, during the reconstruction of which the chemical shift is taken into account.

Description of the Prior Art

In orthopedic imaging, for example, diagnosis requires MR images that are not created using fat suppression. Also with orthopedic imaging, a high resolution and high signal to noise ratio are sought and these can be achieved only with a high field strength (e.g. three Tesla or more). With high field strengths however the chemical shift for example between fat and water produces artifacts known as CSD artifacts ("Chemical Shift Displacement"), which have a negative effect on image quality and the usefulness of the resulting MR images.

SUMMARY OF THE INVENTION

An object of the present invention is to provide an MR image in which a number of substances (for example fat and water) can be identified but in artifacts due to the chemical shift are at least reduced compared with the prior art.

In accordance with the present invention, a method for reconstructing an MR image of a volume segment within an examination object by operation of a magnetic resonance system includes the following steps.

MR data are acquired within the volume segment according to a separation method. In this acquisition, MR data of a k-space line are acquired a number of times respectively in one step, while a readout gradient is switched (activated) in the same readout direction in order thus to scan the entirety of k-space. With the separation method, both an image of a first substance and an image of a second substance are reconstructed based on the acquired MR data. In other words, k-space is scanned (filled) k-space line-by-k-space line, with each k-space line, and therefore also the respective readout gradient, always running in the same direction or parallel. The use of the separation method allows both the image of the first substance and also the image of the second substance to be reconstructed from the MR data thus acquired. A shift length is determined, by which the image of the first substance and the image of the second substance are displaced relative to one another due to the chemical shift in the readout direction. In other words the shift length corresponds to a length or distance (measured in image pixels), by which the image of the first (second) substance is displaced compared with the image of the second (first) substance. The image of the first substance and/or the image of the second substance is displaced as a function of the shift length, in order thus to compensate for or cancel the displacement of the image of the first substance relative to the image of the second substance in the readout direction due to the chemical shift. The displacement of a first image relative to a second image here refers to the fact that each pixel of the first image is displaced relative to the pixels of the second image. The image of the first substance and the image of the second substance are combined, in order thus to generate the MR image. Combining images here refers to a combination (e.g. addition) of the corresponding or superimposed pixel values of the images.

The present invention can be used, for example, to generate an MR image in which both fat and water are mapped, without the inventively generated MR image being distorted due to the chemical shift. As a result, even in magnetic resonance systems with a very high field strength (e.g. 7 Tesla) and a small readout bandwidth it is possible to use a standard turbo spin echo sequence to acquire the MR data in order to generate MR images, which show fat and water, and offer the sufficiently good contrast required for clinical diagnosis.

There are two options for defining shift length. With the first option the shift length is defined as a length by which the image of the first substance is displaced in the readout direction compared with the image of the second substance. With the second option the shift length is defined as a length (e.g. measured in a number of pixels) by which the image of the second substance is displaced in the readout direction compared with the image of the first substance.

To compensate for the chemical shift with the first option the image of the first substance is displaced by x percent of the negative shift length compared with the image of the second substance and the image of the second substance is displaced by (100−x) percent of the shift length compared with the image of the first substance. It is preferable for x=0 or x=100% to be selected here so that only the image of the first substance is displaced by the negative shift length compared with the image of the second substance or only the image of the second substance is displaced by the shift length compared with the image of the first substance.

Similarly, to compensate for the chemical shift with the second option the image of the second substance is displaced by x percent of the negative shift length compared with the image of the first substance and the image of the first substance is displaced by (100−x) percent of the shift length compared with the image of the second substance. It is preferable here for x=0 or x=100% to be selected so that only the image of the first substance is displaced by the shift length compared with the image of the second substance or only the image of the second substance is displaced by the negative shift length compared with the image of the first substance.

The substances can be, for example, water, fat and/or silicone. The present invention can also be used to show fluorine components, which have a number of resonant frequencies. The fluorine component with the first resonant frequency is then deemed to be the first substance and the fluorine component with the second resonant frequency is deemed to be the second substance.

According to one preferred embodiment, selective excitation is not used during the step of acquiring MR data. In other words no slice selection gradient is switched to acquire the MR data when radiating in the RF excitation pulse. Therefore two phase encoding gradients in particular are switched to acquire the respective k-space line, with the two phase encoding gradients and the readout gradient being mutually perpendicular to one another.

The advantage of this embodiment is that there is no chemical shift in the slice selection direction because there is no slice selection gradient present. Even if a phase encoding gradient is used in the slice selection direction, seemingly in place of the slice selection gradient, it does not produce a chemical shift unlike slice selection. This embodiment precludes the situation where as it were two different slices are excited by the RF excitation in the space for fat and water. Also the situation that occurs in the prior art with significant field strengths, in which fat is located seemingly outside the examination object, so that the resulting MR image appears to have what is known as a fat saturation contrast even though the user did not want fat saturation and specified the protocol accordingly, is not possible.

Both a gradient echo sequence and a spin echo sequence can be used to acquire the MR data.

A spin echo sequence here can include the following sub-steps. A non-selective RF excitation pulse is radiated. As the non-selective RF excitation pulse is being radiated, no slice selection gradient is switched (activated). A non-selective refocusing pulse is radiated. It is also the case that no gradient (slice selection gradient) is switched while the non-selective refocusing pulse is radiated. A first phase encoding gradient is activated in a first direction, which can be, for example, a slice selection direction. A second phase encoding gradient is activated in a second direction, which is perpendicular to the first direction. MR data of a k-space line are acquired while the readout gradient is activated. The readout direction (direction, in which the readout gradient is switched) here is perpendicular to the first direction and to the second direction.

All the sub-steps apart from the first sub-step (radiating the non-selective RF excitation pulse) are executed a number of times, so the MR data for a number of k-space lines are acquired based on the same RF excitation pulse. The number of k-space lines acquired with the same RF excitation pulse is also known as the echo train length.

The shift length can be determined as a function of the field strength of the magnetic resonance system, a readout bandwidth and the chemical shift of the resonant frequency of the first substance compared with the resonant frequency of the second substance.

For example the shift length V defined by a number of image pixels can be determined by the following equation (1).

$$V = \frac{\gamma \times \delta \times FS \times AP}{ABB} \quad (1)$$

Here $\gamma$ is the gyromagnetic ratio, $\delta$ is a dimensionless parameter representing the chemical shift, FS is the field strength of the magnetic resonance system, AP is a number of pixels that can be scanned per k-space line, and ABB is the readout bandwidth. $\delta$ is determined according to the following equation (2).

$$\delta[ppm] = \frac{f_1 - f_2}{f_2} \times 10^6. \quad (2)$$

Here f1 is the resonant frequency of the first substance and f2 is the resonant frequency of the second substance.

With a field strength of 1.5 Tesla, a readout bandwidth of 32 kHz and 256 pixels per k-space line the shift length V for a chemical shift between fat and water of 3.5 ppm is for example 1.76 pixels. In this example therefore each pixel of the fat signal image (image of the first substance) is displaced by 1.76 pixels in the readout direction compared with the water signal image (image of the second substance), before the fat signal image is combined with the water signal image.

The invention has thus far been described with regard to only two substances. It is also possible to use the present invention to correct the chemical shift with respect to more than two substances. To this end, N images are reconstructed from the MR data, with N>2. Essentially a different one of N substances is mapped or shown in each of the N images. For each of these N images an individual shift length is determined by which the respective image is displaced compared with a determined one of the N images due to the chemical shift in the readout direction. Each of the N images is displaced in the readout direction as a function of this individual shift length compared with the determined image, in order thus to compensate for or cancel the displacement of the respective image compared with the determined image in the readout direction due to the chemical shift. All N images are then combined to generate the MR image.

The extension of the present invention to more than two substances as described above allows for example an MR image to be generated, in which silicone is shown as well as fat and water without falsifying the MR image due to the chemical shift in the readout direction. The present invention can also be used to generate an MR image of substance mixtures, such a substance mixture consisting of substances with different resonant frequencies. For example certain fluorine components have a number of different resonant frequencies. According to the invention such fluorine components would be interpreted as a substance mixture of substances with the different resonant frequencies. An image is created for each resonant frequency. The images are then displaced relative to one another as described above in order to compensate for the chemical shift in the readout direction, before the images are then combined to produce an MR image which shows the fluorine components without CSD effect in the generated MR image.

Separation methods or imaging methods which allow the reconstruction of the image of the first substance and the image of the second substance (or the reconstruction of N images, each showing essentially one of N substances) are referred to as spectroscopic imaging or chemical shift imaging. Some of these separation methods or imaging methods are based on what is known as the Dixon's method (see for example "Handbook of MRI Pulse Sequences", M. A. Bernstein inter alia, ISBN-13: 978-0-12-092861-3, chapter 17.3. Dixon's Method). A separation method specifically for creating a number of images of different substances or different resonant frequencies was described for example in 2001 in "Chemical shift imaging with spectrum modeling", by L. An and Q. Xing, in Magn.Reson.Med. 46, pages 126-130.

The present invention also provides a magnetic resonance apparatus for acquiring MR data of a volume segment within an examination object. The magnetic resonance apparatus (i.e. the scanner thereof) has a basic field magnet, a gradient field system, one or more RF antennas and a control computer for activating the gradient field system and the RF antenna(s), for receiving the measured signals picked up by the RF antenna(s), and for evaluating the measured signals and for creating the MR data. The magnetic resonance apparatus is configured to acquire MR data within the volume segment according to a separation method, by the magnetic resonance scanner being operated to acquire the MR data of an entire k-space line in one step while the gradient field system activates a readout gradient in the same readout direction. With the use of this separation method, the control computer reconstructs an image of a first substance and an image of a second substance from the MR data. The control computer, in particular the system computer of the magnetic resonance apparatus, determines a shift length, by which the image of the first substance and the image of the second substance are displaced relative to one another due to the chemical shift in the readout direction. Based on this shift length the control computer displaces the image of the first substance and/or the image of the second substance, in order to compensate for or cancel the displacement of the image of the first substance relative to the image of the second substance in the readout direction due to the chemical shift. Finally the control computer combines the image of the first substance and the image of the second substance, in order to generate the MR image.

The advantages of the inventive magnetic resonance apparatus correspond essentially to the advantages of the inventive method as described in detail above.

The present invention also encompasses a non-transitory, computer-readable data storage medium that can be loaded into a memory of a programmable control computer of a magnetic resonance apparatus. The storage medium is encoded with programming instructions that cause the computer to implement all or various of the embodiments of the inventive method described above when the programming instructions are executed in the control computer. The programming instructions may require program means, e.g. libraries and auxiliary functions, to implement the corresponding embodiments of the method. The software (programming instructions) can be a source code (e.g. C++), which has still to be compiled and linked or which only has to be interpreted, or an executable software code which only has to be loaded into the corresponding computation unit or control computer for execution.

The electronically readable data medium can be, for example, a DVD, a magnetic tape, a hard drive or a USB stick, on which electronically readable control information, in particular software (see above), is stored.

The present invention allows MR images to be generated in which different substances which have different resonant frequencies are shown in the correct place in relation to one another.

The invention allows the creation of MR images which show fat and water combined, it being possible to use PD (proton density)-weighted imaging with minimal or even longer echo time and even T2-weighted imaging. Either a two-dimensional spin echo sequence or a turbo spin echo sequence can be used here.

BRIEF DESCRIPTION OF THE DRAWINGS

FIG. 2 is a schematic representation of an actual object which has a fat component and a water component.

FIG. 3 shows a water signal image and a fat signal image one above the other.

FIG. 4 shows an inventively generated MR image of the object shown in FIG. 2.

DESCRIPTION OF THE PREFERRED EMBODIMENTS

Figure 1:
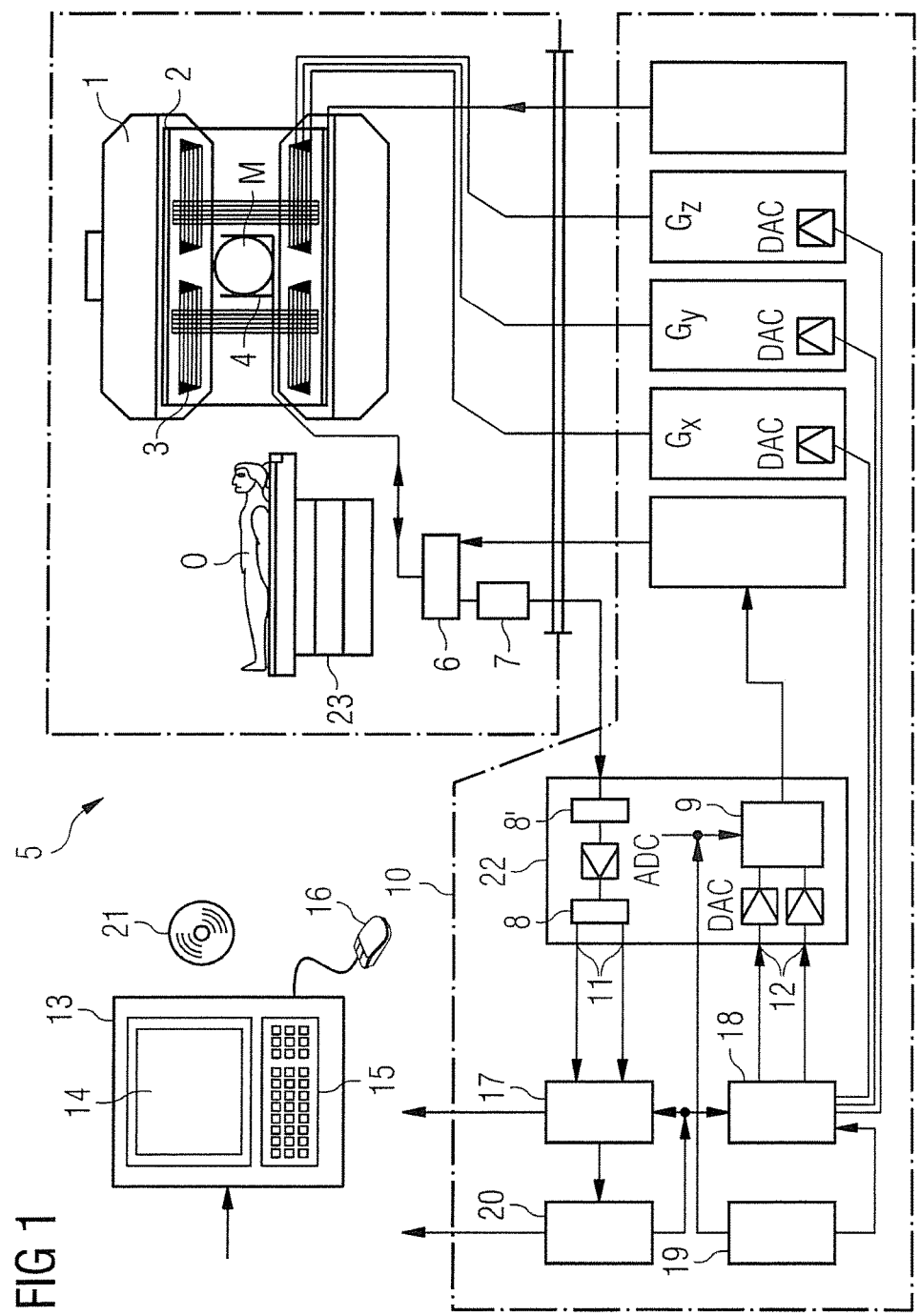
FIG. 1 shows an inventive magnetic resonance system.

FIG. 1 shows a schematic representation of an inventive magnetic resonance scanner 5 (of a magnetic resonance imaging or nuclear spin tomography apparatus). A basic field magnet 1 generates a temporally constant powerful magnetic field for polarizing or aligning the nuclear spin in an examination region of an object O, for example a part of a human body to be examined, which is lying on a table 23 and is moved continuously into the magnetic resonance system 5. The high homogeneity of the basic magnetic field required for the nuclear spin resonance measurement is defined in a typically spherical measurement volume M, in which the parts of the human body to be examined are preferably measured. To assist the homogeneity requirements and in particular to eliminate temporally invariable influences what are known as shim plates made of a ferromagnetic material are positioned at an appropriate point. Temporally variable influences are eliminated by shim coils 2.

Mounted in the basic field magnet 1 is a cylindrical gradient field system or gradient field system 3, having three sub-windings. Each sub-winding is supplied by an amplifier with power for generating a linear (also temporally changeable) gradient field in a respective direction of the Cartesian coordinates system. The first sub-winding of the gradient field system 3 generates a gradient $G_x$ in the x direction, the second sub-winding generates a gradient $G_y$ in the y direction and the third sub-winding generates a gradient $G_z$ in the z direction. Each amplifier has a digital/analog converter, which is activated by a sequence controller 18 to generate gradient pulses at the correct times.

Within the gradient field system 3 is one (or more) radio-frequency antenna(s) 4, which convert the radio-frequency pulses emitted by a radio-frequency power amplifier to an alternating magnetic field to excite the nuclei and align the nuclear spins of the object O to be examined or the region of the object O to be examined. Each radio-frequency antenna 4 is composed of one or more RF transmit coils and one or more RF receive coils in the form of a ring-shaped, preferably linear or matrix-type, arrangement of component coils. The RF receive coils of the respective radio-frequency antenna 4 also convert the alternating field emanating from the preceding nuclear spins, in other words generally the nuclear spin echo signals produced by a pulse sequence from one or more radio-frequency pulses and one or more gradient pulses, to a voltage (measuring signal), which is supplied via an amplifier 7 to a radio-frequency receive channel 8 of a radio-frequency system 22. The radio-frequency system 22, which is part of a control computer 10 of the magnetic resonance system 5, also comprises a transmit channel 9, in which the radio-frequency pulses for exciting the magnetic nuclear resonance are generated. The respective radio-frequency pulses are shown digitally as a sequence of complex numbers based on a pulse sequence predetermined by the system computer 20 in the sequence controller 18. This number sequence is supplied as a real part and an imaginary part via respective inputs 12 in each instance to a digital/analog converter in the radio-frequency system 22 and from this to a transmit channel 9. In the transmit channel 9 the pulse sequences are modulated to a radio-frequency carrier signal, the base frequency of which corresponds to the resonant frequency of the nuclear spins in the measurement volume.

The switch from transmit mode to receive mode takes place via a diplexer 6. The RF transmit coils of the radio-frequency antenna(s) 4 radiate(s) the radio-frequency pulses for exciting the nuclear spins into the measurement volume M and resulting echo signals are scanned via the RF receive coil(s). The nuclear resonance signals thus obtained are demodulated in the receive channel 8' (first demodulator) of the radio-frequency system 22 in a phase-sensitive manner to an intermediate frequency, digitized in the analog/digital converter (ADC) and output by way of the output 11. This signal is further demodulated to the frequency 0. Demodulation to the frequency 0 and separation into real and imaginary components take place after digitization in the digital domain in a second demodulator 8. An image processor 17 reconstructs an MR image from the measurement data obtained in this manner by way of an output 11. The measurement data, image data and control programs are managed by the system computer 20. A default with control programs allows the sequence controller 18 to monitor the generation of the respectively desired pulse sequences and the corresponding scanning of the k-space. In particular the sequence controller 18 here controls the switching of the gradients at the correct time, the transmission of the radio-frequency pulses with defined phase amplitude (including refocusing pulses) and the receiving of the nuclear resonance signals. The inventive sequence controller 18 is configured to acquire the MR data according to a separation method (e.g. the Dixon technique) k-space line-by-k-space line, with all the k-space lines running parallel. The inventive image processor 17 first reconstructs an image of a first substance and an image of a second substance from the MR data according to the separation method, before the image processor 17 displaces at least one of the two images according to a shift length and then combines both images to generate a combined MR image, which maps the positions of both substances accurately. The shift length is calculated as a function of the resonant frequency of the two substances by the inventive system computer 20. The time base for the radio-frequency system 22 and the sequence controller 18 is supplied by a synthesizer 19. The selection of corresponding control programs for generating an MR image, which are stored for example on a DVD 21, and the presentation of the generated MR image take place at a terminal 13, which has a keyboard 15, a mouse 16 and a screen 14.

FIG. 2 shows a schematic representation of the situation of an actual examination object, which contains water 31 and fat 32.

According to the invention, MR data of a volume segment of said examination object is acquired according to the Dixon's method. The Dixon's method is then used to reconstruct a water signal image 41 (image of a first substance) and a fat signal image 42 (image of a second substance) from the previously acquired MR data. It can be seen that the fat pixels 32 are displaced by a shift length V compared with the water pixels 31. In other words the fat signal image 42 is displaced by the shift length V (measured in pixels) compared with the water signal image 41.

According to the invention, this shift V is compensated for or canceled, in that either the fat signal image 42 is displaced by the negative shift length –V (i.e. in a negative direction by the corresponding number of pixels), as shown in FIG. 4, or in that the water signal image 31 is displaced by the positive shift length V (i.e. in a positive direction by the corresponding number of pixels). After such displacement the two images 41, 42 are combined to give the MR image or the fat/water image 43.

Figure 5:
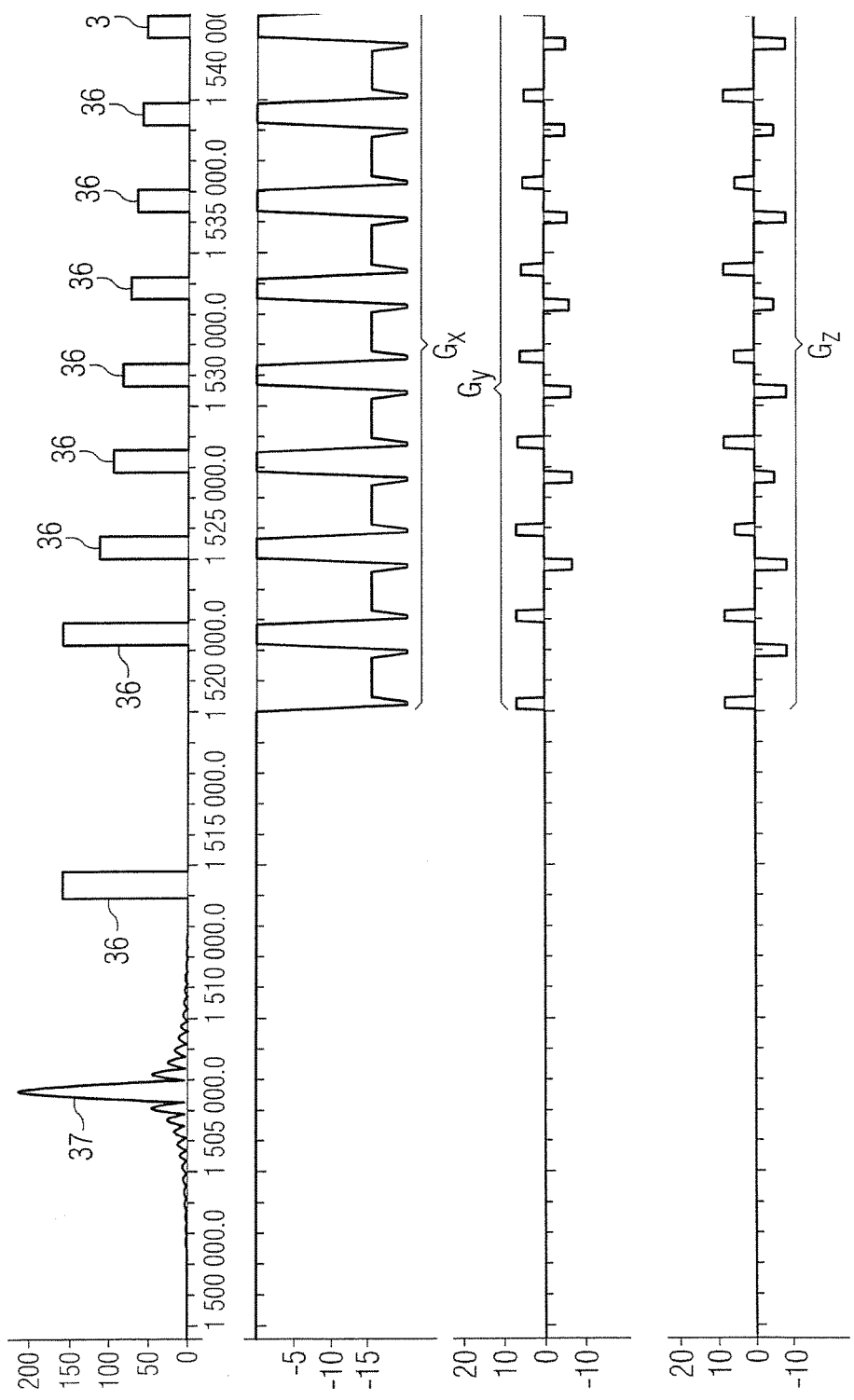
FIG. 5 shows an inventive turbo spin echo sequence.

FIG. 5 shows an inventive sequence for acquiring the MR data.

The sequence starts with a non-selective RF excitation pulse 37 being radiated in. A non-selective refocusing pulse 36 is then radiated in, before a first phase encoding gradient $G_z$ and a second phase encoding gradient $G_y$ are used to navigate to a determined k-space line, which is then read out with the aid of a readout gradient $G_x$. By radiating in further refocusing pulses 36 and switching further first phase encoding gradients $G_z$ and further second phase encoding gradients $G_y$, it is possible to use further readout gradients $G_x$ to read out further k-space lines, before a further non-selective RF excitation pulse 37 is radiated in.

As the sequence illustrated in FIG. 5 does not have a slice selection gradient (either for the RF excitation pulse 37 or for the refocusing pulse 36), the CSD effect advantageously does not occur either when radiating in the RF excitation pulse 37 or when radiating in the refocusing pulse 36. It can also be seen in FIG. 5 that the readout gradient $G_x$ has a greater gradient moment than the first phase encoding gradient $G_z$ or the second phase encoding gradient $G_y$. This means that the CSD effects are essentially produced by the readout gradient $G_x$. According to the invention these CSD effects specifically are compensated for along the readout gradient $G_x$ in that the water signal image 41 and the fat signal image 42 are displaced in relation to one another based on the shift length V, before the two images 41, 42 are combined to produce the MR image 43.

Figure 6:
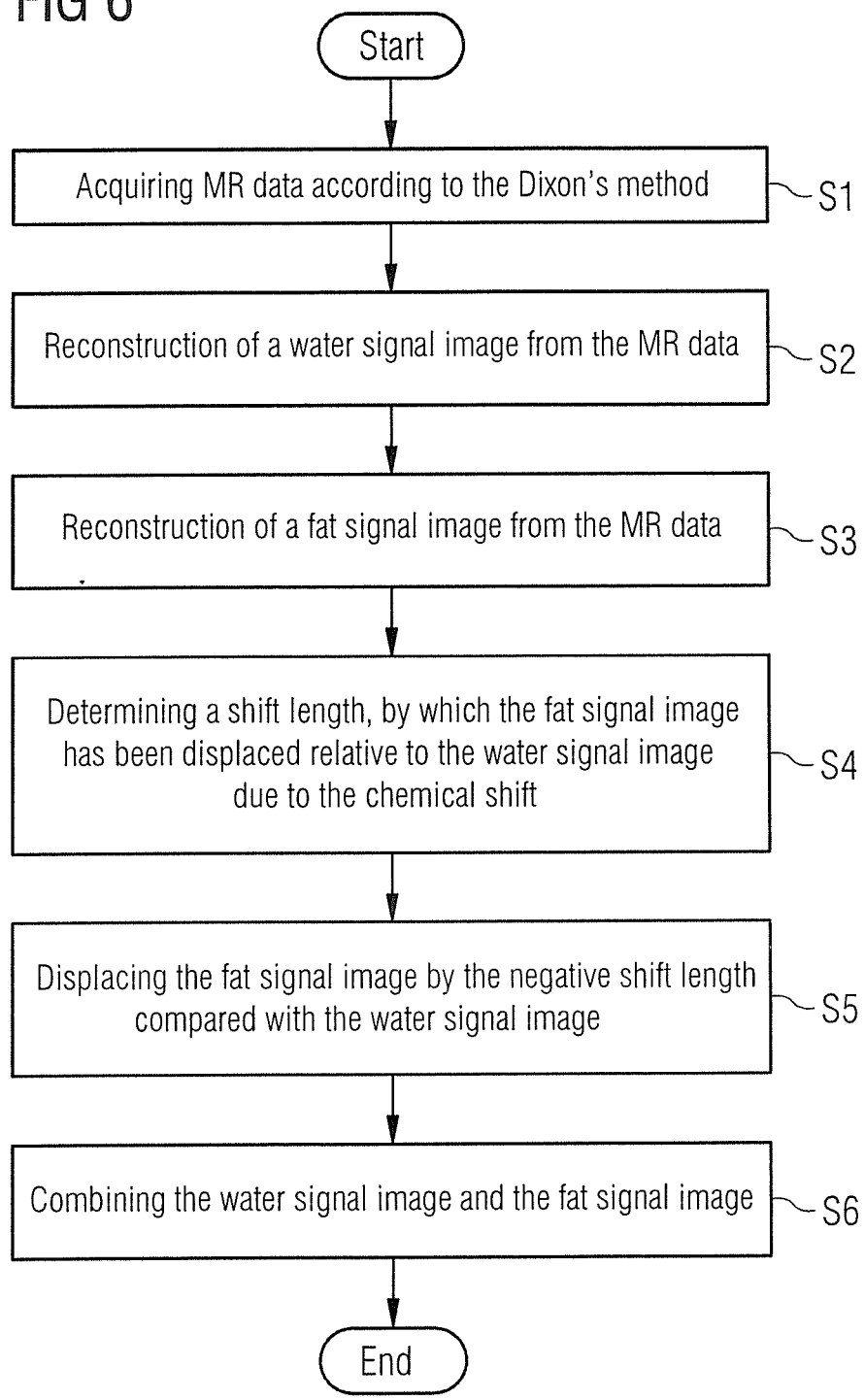
FIG. 6 is a flowchart of the inventive method for reconstructing an MR image.

FIG. 6 shows the flow diagram of an inventive method for reconstructing an MR image 43.

In step S1 MR data of the predetermined volume segment of the examination object is acquired according to the Dixon's method. It should be noted here that the Dixon's method can operate both with spin echo sequences and with gradient echo sequences. In step S2 the Dixon's method is used to reconstruct a water signal image 41 from the MR data and in step S3 a fat signal image 42.

In step S4 a shift length V is determined, by which the fat signal image 42 has been displaced compared with the water signal image 41 due to the chemical shift in the readout direction. In step S5 the fat signal image 42 is displaced by the negative shift length V compared with the water signal image 41 in order to compensate for the CSD effects in the readout direction. Finally in step S6 the water signal image 41 is combined with the fat signal image 42, thereby producing the MR image 43 to be generated.

Although modifications and changes may be suggested by those skilled in the art, it is the intention of the inventors to embody within the patent warranted hereon all changes and modifications as reasonably and properly come within the scope of their contribution to the art.

We claim as our invention:
1. A method for reconstructing a magnetic resonance (MR) image of a volume within an examination object, said volume comprising a plurality of substances, and comprising:
   operating an MR scanner, while an examination object is situated therein, to acquire MR data from a volume segment within the examination object, with no selective excitation of nuclear spins in said volume segment, according to a separation method wherein the MR data are entered into an electronic memory representing k-space, comprising a plurality of k-space lines, with data being entered into each respective k-space line while a readout gradient is switched in a same readout direction;
   in a processor having access to said memory, reconstructing an image of a first substance of said plurality of substances within said volume and an image of a second substance of said plurality of substances within said volume from the MR data entered into k-space;
   in said processor, determining a shift length by which the image of the first substance and the image of the second substance are displaced relative to each other due to the chemical shift in the readout direction;
   in said processor, displacing one of said image of said first substance or said image of said second substance dependent on said shift length to compensate for the relative displacement between the image of the first substance and the image of the second substance in the readout direction due to the chemical shift; and in said processor, combining the image of the first substance and the image of the second substance, after said displacement, to generate an MR image of said volume, and making the MR image of said volume available from the processor as a data file.

2. A method as claimed in claim 1, wherein said shift length defines a length by which the image of the first substance is displaced relative to the image of the second substance in the readout direction, with the image of the first substance being displaced by a percent of the shift length and the image of the second substance is displaced by a percent of the shift length.

3. A method as claimed in claim 1 wherein the shift length defines a length by which the image of the second substance is displaced relative to the image of the first substance in the readout direction, with the image of the second substance being displaced by a percent of the negative shift length, and wherein the image of the first substance is displaced by a percent of the shift length.

4. A method as claimed in claim 1 wherein said first substance is water and said second substance is fat.

5. A method as claimed in claim 1 comprising operating said MR scanner with a gradient echo sequence to acquire said MR data.

6. A method as claimed in claim 5 comprising operating said MR scanner to acquire said MR data by:
- radiating a non-selective RF excitation pulse without activation of a gradient;
- radiating a non-selective refocusing pulse with activation of a gradient;
- activating a first phase encoding gradient in a first direction;
- activating a second phase encoding gradient in a second direction that is perpendicular to said first direction;
- acquiring the MR data for the respective k-space lines while activating a readout gradient, said readout gradient being perpendicular to said first direction and to said second direction; and
- repeating all steps above, except for radiating said RF excitation pulse, in a plurality of repetitions until said MR data are entered into a plurality of k-space lines following a same RF excitation pulse.

7. A method as claimed in claim 5 comprising determining the shift length in a plurality of image cells according to:

$$V = \frac{\gamma \times \delta \times FS \times AP}{ABB},$$

where $\gamma$ corresponds to the gyromagnetic ratio, FS corresponds to the field strength of the magnetic resonance system (5), AP corresponds to a number of pixels per k-space line, ABB corresponds to the readout bandwidth and the chemical shift is described using the dimensionless parameter $\delta$ according to the following equation $$\delta[ppm] = \frac{f_1 - f_2}{f_2} \times 10^6,$$

where $f_1$ corresponds to the resonant frequency of the first substance and $f_2$ the resonant frequency of the second substance.

8. A method as claimed in claim 1 comprising operating said MR scanner with a spin echo sequence to acquire said MR data.

9. A method as claimed in claim 1 comprising determining said shift length as a function of a field strength in the MR scanner, a readout bandwidth, and the chemical shift of the resonant frequency of the first substance relative to the resonant frequency of the second substance.

10. A method as claimed in claim 1 comprising:
- employing, as said separation method, a separation method wherein N images are reconstructed, with N >2, with one substance of said plurality of substances in each of the N images, so that each of the N images maps a different substance from the other images;
- for each of said N images, determining an individual shift length by which that respective image is displaced relative to a predetermined one of the N images due to a chemical shift in the readout out;
- displacing each of said images relative to the predetermined image dependent on the respective individual shift length thereof in the readout direction, to compensate for the displacement of the respective image relative to the predetermined image in the readout direction to the chemical shift; and
- combining the N images to generate said MR image of said volume.

11. A method as claimed in claim 1 comprising employing, as said separation method, a separation method based on the Dixon technique.

12. A magnetic resonance (MR) apparatus, comprising:
an MR scanner;
a control computer configured to operate said MR scanner, while an examination object is situated therein, to acquire MR data from a volume segment within the examination object, with no selective excitation of nuclear spins in said volume segment, and wherein said examination volume comprises a plurality of substances, according to a separation method wherein the MR data are entered into an electronic memory representing k-space, comprising a plurality of k-space lines, with data being entered into each respective k-space line while a readout gradient is switched in a same readout direction;
a processor having access to said memory, said processor being configured to reconstruct an image of a first substance of said plurality of substances within said volume and an image of a second substance of said plurality of substances within said volume from the MR data entered into k-space;
said processor being configured to determine a shift length by which the image of the first substance and the image of the second substance are displaced relative to each other due to the chemical shift in the readout direction;
said processor being configured to displace one of said image of said first substance or said image of said second substance dependent on said shift length to compensate for the relative displacement between the image of the first substance and the image of the second substance in the readout direction due to the chemical shift; and
said processor being configured to combine the image of the first substance and the image of the second substance, after said displacement, to generate an MR image of said volume, and to make the MR image of said volume available from the processor as a data file.

13. A non-transitory, computer-readable data storage medium encoded with programming instructions, said storage medium being loaded into a control computer of a magnetic resonance (MR) apparatus that also comprises an MR scanner, and said programming instructions causing said control computer to:
- operate an MR scanner, while an examination object is situated therein, to acquire MR data from a volume segment within the examination object, with no selective excitation of nuclear spins in said volume segment, and wherein said examination volume comprises a plurality of substances, according to a separation method wherein the MR data are entered into an electronic memory representing k-space, comprising a plurality of k-space lines, with data being entered into each respective k-space line while a readout gradient is switched in a same readout direction;
- reconstruct an image of a first substance of said plurality of substances within said volume and an image of a second substance of said plurality of substances within said volume from the MR data entered into k-space;
- determine a shift length by which the image of the first substance and the image of the second substance are displaced relative to each other due to the chemical shift in the readout direction;
- displace one of said image of said first substance or said image of said second substance dependent on said shift length to compensate for the relative displacement between the image of the first substance and the image of the second substance in the readout direction due to the chemical shift; and
- combine the image of the first substance and the image of the second substance, after said displacement, to generate an MR image of said volume, and make the MR image of said volume available from the processor as a data file.

* * * * *